US012751336B2

(12) United States Patent
Imaizumi et al.

(10) Patent No.: US 12,751,336 B2

(45) Date of Patent: Sep. 29, 2026

(54) ISOLATOR

(71) Applicants: Kabushiki Kaisha Toshiba, Tokyo (JP); Toshiba Electronic Devices & Storage Corporation, Tokyo (JP)

(72) Inventors: Yusuke Imaizumi, Kawasaki Kanagawa (JP); Jia Liu, Yokohama Kanagawa (JP); Yoshinari Tamura, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 350 days.

(21) Appl. No.: 18/463,789

(22) Filed: Sep. 8, 2023

(65) Prior Publication Data

US 2024/0321850 A1 Sep. 26, 2024

(30) Foreign Application Priority Data

Mar. 24, 2023 (JP) ................................ 2023-048707

(51) Int. Cl.
*H10W 90/00* (2026.01)
*H10D 86/85* (2025.01)
(Continued)

(52) U.S. Cl.
CPC .......... *H10W 90/00* (2026.01); *H10W 90/811* (2026.01); *H10D 86/85* (2025.01); (Continued)

(58) Field of Classification Search
CPC ..... H10W 72/50; H10W 72/20; H10W 72/90; H10W 72/417; H10W 74/111; (Continued)

(56) References Cited

U.S. PATENT DOCUMENTS 9,035,422 B2 5/2015 Khanolkar et al.
2008/0061631 A1* 3/2008 Fouquet .................. H03H 7/46 307/109
2010/0259909 A1* 10/2010 Ho ........................ H10W 70/40 361/767
2017/0005046 A1 1/2017 Sin
(Continued)

FOREIGN PATENT DOCUMENTS

JP H08-222438 A 8/1996
JP H10-74626 A 3/1998
(Continued)

OTHER PUBLICATIONS

Decision to Grant a Patent dated May 26, 2026, mailed in counterpart Japanese Application No. 2023-048707, 5 pages.

*Primary Examiner* — Marc-Anthony Armand
(74) *Attorney, Agent, or Firm* — Kim & Stewart LLP

(57) ABSTRACT

According to one embodiment, an isolator includes an isolator module including a first substrate, a first insulating layer in contact with a top surface of the first substrate, a second insulating layer in contact with a bottom surface of the first substrate, a first coil arranged at a same height as the first insulating layer, and a second coil arranged at a same height as the second insulating layer and facing the first coil; a first conductor arranged below the isolator module and electrically connected to a bottom surface of the second coil; and a first chip, wherein the second coil and a top surface of the first chip are electrically connected to each other with the first conductor interposed.

16 Claims, 11 Drawing Sheets

(51) Int. Cl.

| | |
|---|---|
| ***H10W 72/30*** | (2026.01) |
| ***H10W 72/50*** | (2026.01) |
| ***H10W 72/90*** | (2026.01) |
| ***H10W 74/10*** | (2026.01) |

(52) U.S. Cl.
CPC ........ *H10W 72/30* (2026.01); *H10W 72/5445* (2026.01); *H10W 72/932* (2026.01); *H10W 72/944* (2026.01); *H10W 74/114* (2026.01); *H10W 90/722* (2026.01); *H10W 90/732* (2026.01); *H10W 90/736* (2026.01); *H10W 90/753* (2026.01); *H10W 90/756* (2026.01)

(58) Field of Classification Search
CPC ........... H10W 70/465; H01L 23/49513; H01L 23/3107; H01L 23/4952; H01L 23/5227
See application file for complete search history.

(56) References Cited

U.S. PATENT DOCUMENTS

| | | | | |
|---|---|---|---|---|
| 2019/0057942 | A1* | 2/2019 | Male | H01L 23/66 |
| 2021/0066217 | A1* | 3/2021 | Carpenter | H01L 23/5227 |
| 2023/0093818 | A1 | 3/2023 | Murasaki et al. | |
| 2023/0309228 | A1 | 9/2023 | Imaizumi et al. | |
| 2024/0014115 | A1* | 1/2024 | Chen | H10W 70/611 |
| 2024/0136347 | A1 | 4/2024 | Nishimura | |

FOREIGN PATENT DOCUMENTS

| | | | |
|---|---|---|---|
| JP | 2008061236 | A | 3/2008 |
| JP | 2010-028542 | A | 2/2010 |
| JP | 2017204540 | A | 11/2017 |
| JP | 2017538277 | A | 12/2017 |
| JP | 2023002699 | A | 1/2023 |
| JP | 2023-046880 | A | 4/2023 |
| JP | 2023-141929 | A | 10/2023 |
| WO | 2023282040 | A1 | 1/2023 |

* cited by examiner

ISOLATOR

CROSS-REFERENCE TO RELATED APPLICATIONS

This application is based upon and claims the benefit of priority from Japanese Patent Application No. 2023-048707, filed Mar. 24, 2023, the entire contents of which are incorporated herein by reference.

FIELD

Embodiments described herein relate generally to an isolator.

BACKGROUND

An isolator configured to transmit a signal from a transmitter circuit to a receiver circuit while mutually insulating these circuits has been known.

DETAILED DESCRIPTION

Figure 1:
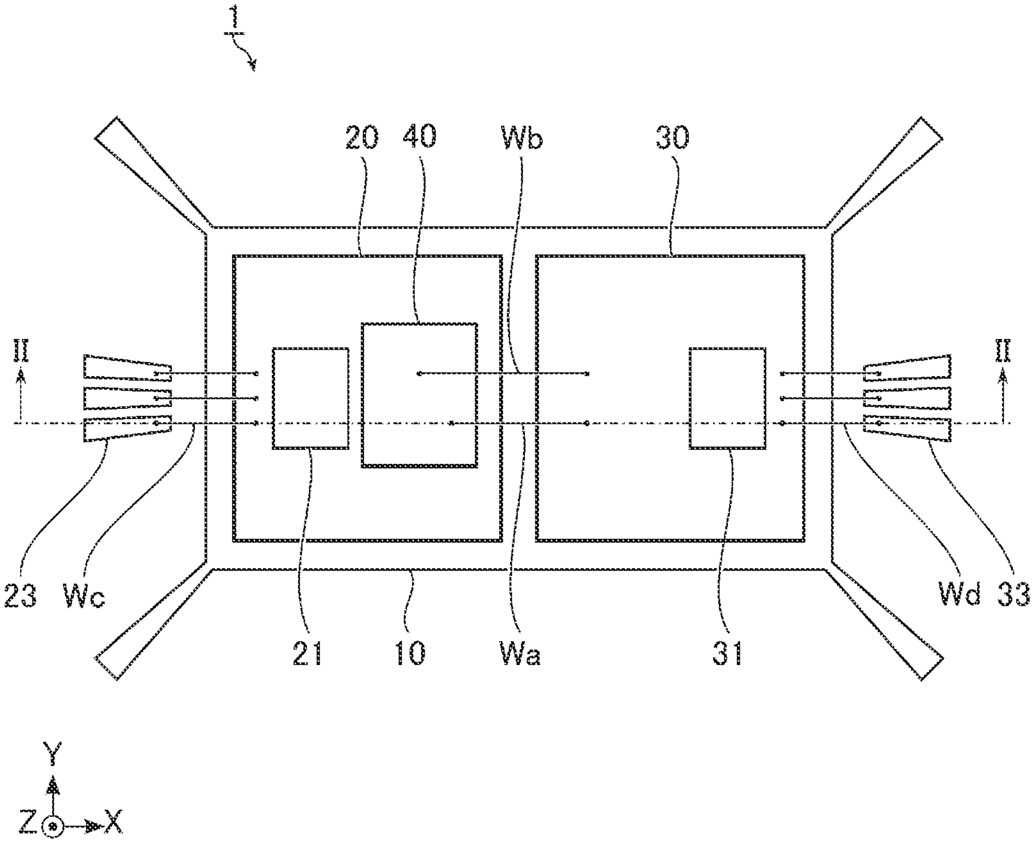
FIG. 1 is a plan view showing an exemplary planar layout of an isolator according to the present embodiment.

In general, according to one embodiment, an isolator includes an isolator module including a first substrate, a first insulating layer in contact with a top surface of the first substrate, a second insulating layer in contact with a bottom surface of the first substrate, a first coil arranged at a same height as the first insulating layer, and a second coil arranged at a same height as the second insulating layer and facing the first coil; a first conductor arranged below the isolator module and electrically connected to a bottom surface of the second coil; and a first chip, wherein the second coil and a top surface of the first chip are electrically connected to each other with the first conductor interposed.

The embodiments will be described below with reference to the drawings. Dimensions and proportions of the drawings may not correspond to the actual dimensions and proportions.

In the description below, the same reference numerals will be given to structural components having the same functions and structures. If the components having similar structures need to be distinguished from each other, distinctive letters or numerals may be added at the end of the common reference numerals.

1. Embodiment

The isolator according to the present embodiment will be described.

Figure 2:
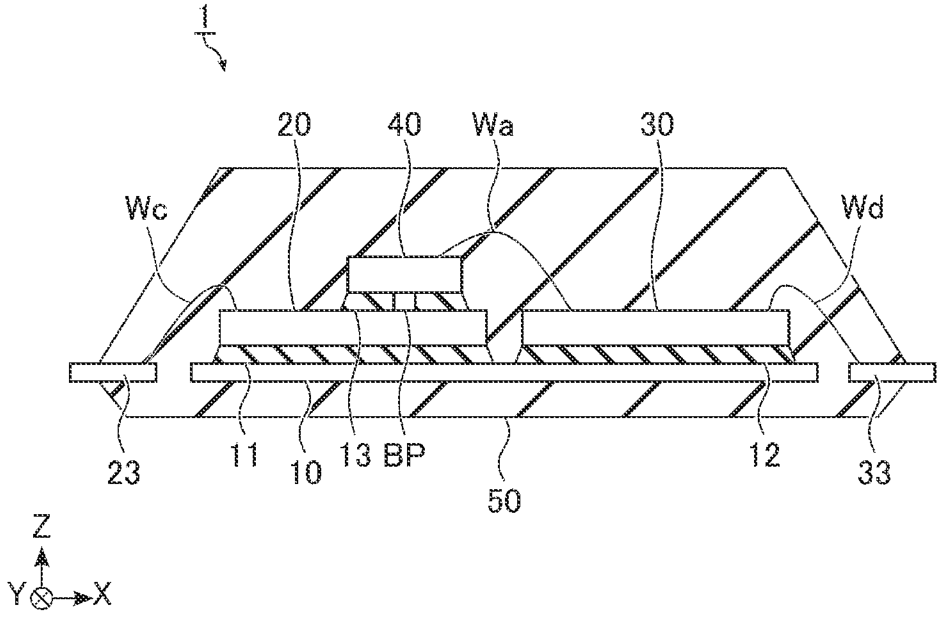
FIG. 2 is a cross-sectional view showing an exemplary cross-sectional structure of the isolator according to the present embodiment, taken along line II-II in FIG. 1.

FIG. 1 is a plan view showing an exemplary planar layout of the isolator according to the present embodiment, and FIG. 2 is a cross-sectional view showing an exemplary cross-sectional structure of the isolator according to the present embodiment, taken along line II-II in FIG. 1. As illustrated in FIGS. 1 and 2, the isolator package 1 is a package that includes a digital isolator. The isolator package 1 includes a frame 10, semiconductor chips 20 and 30, an isolator module 40, and an insulating member 50. The insulating member 50 is not shown in FIG. 1.

The frame 10 may be a metal plate member. The semiconductor chips 20 and 30 are arranged on the surface of the frame 10 with insulative adhesive members 11 and 12 respectively interposed. The frame 10 serves as a substrate that supports the semiconductor chips 20 and 30.

In the description below, a plane parallel to the surface of frame 10 will be referred to as an X-Y plane. The directions mutually intersecting on the X-Y plane will be referred to as an X direction and Y direction. The direction intersecting the X-Y plane will be referred to as a Z direction. The Z direction oriented from the frame 10 toward the semiconductor chips 20 and 30 may also be referred to an upward direction.

The isolator module 40 is arranged on the top surface of the semiconductor chip 20 with an insulative adhesive member 13 interposed. When viewed in the Z direction, the isolator module 40 is arranged at a position that overlaps the semiconductor chip 20.

A circuit 21 is formed in the semiconductor chip 20. This circuit 21 includes a signal transmission/reception circuit and a signal modulation/demodulation circuit. The circuit 21 is electrically connected to the isolator module 40 with a conductor BP interposed, where the conductor BP is provided on the top surface of the semiconductor chip 20. That is, the semiconductor chip 20 and the isolator module 40 are electrically connected to each other, for examples through flip-chip bonding. The conductor BP may be a bump, or may be formed by soldering. The semiconductor chip 20 is electrically connected to a pin 23 by a bonding wire Wc.

The semiconductor chip 30 is aligned with the semiconductor chip 20 in the X direction. A circuit 31 is formed in the semiconductor chip 30. This circuit 31 includes a signal transmission/reception circuit and a signal modulation/demodulation circuit. The circuit 31 is electrically connected to the isolator module 40 by bonding wires Wa and Wb. The semiconductor chip 30 is electrically connected to a pin 33 by a bonding wire Wd.

The isolator module 40 may function as a digital isolator. The isolator module 40 is provided with a transformer. The isolator module 40 adopts a transformer to transmit a signal with the transmitter circuit (primary circuit) insulated from the receiver circuit (secondary circuit). The structure of the isolator module 40 will be describe later.

The insulating member 50 may contain an insulative resin. The frame 10, the semiconductor chips 20 and 30, the isolator module 40, and the bonding wires Wa and Wb are sealed in by the insulating member 50. The pins 23 and 33 are secured by the insulating member 50, each having a portion exposed to the outside of the insulating member 50.

With the above configuration, the isolator package 1 transmits signals between the pins 23 and 33 via the isolator module 40.

Figure 3:
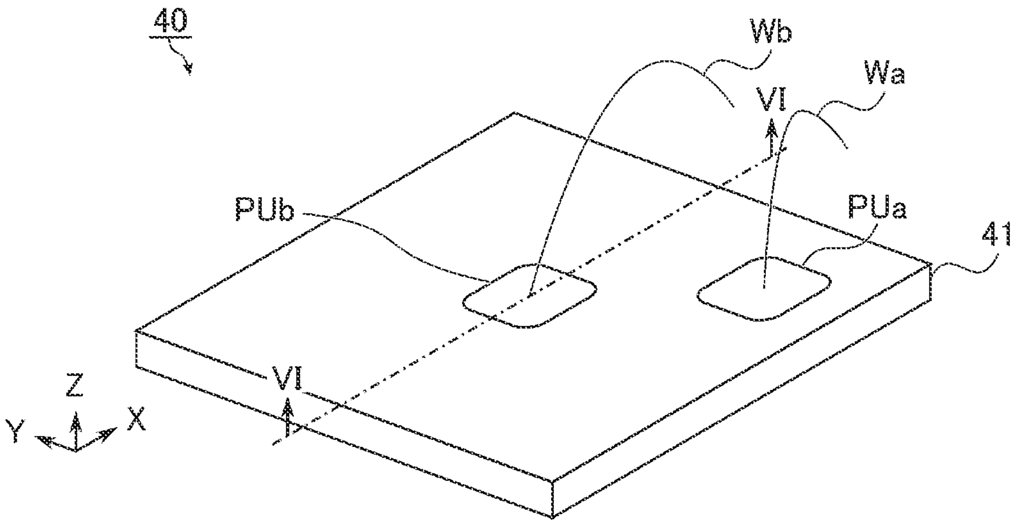
FIG. 3 is a perspective view showing an exemplary structure of an isolator module according to the present embodiment.
Figure 4:
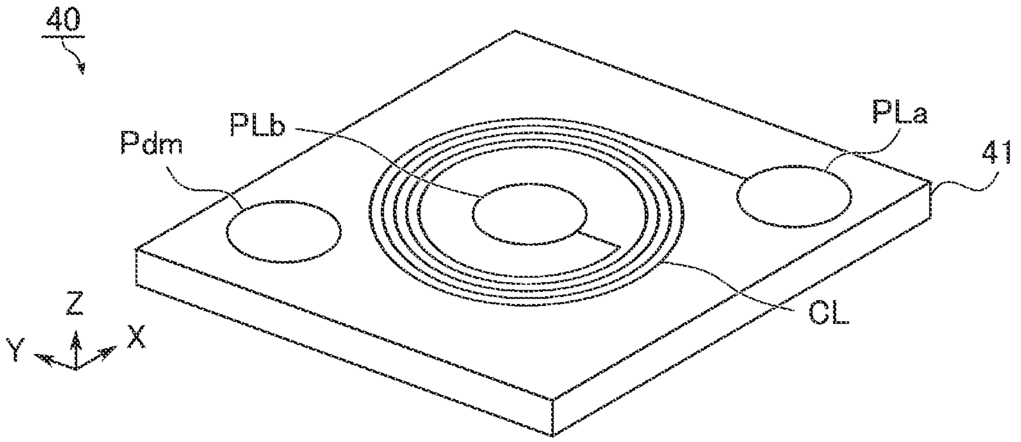
FIG. 4 is a perspective view showing an exemplary structure of a primary circuit in the isolator module according to the present embodiment.
Figure 5:
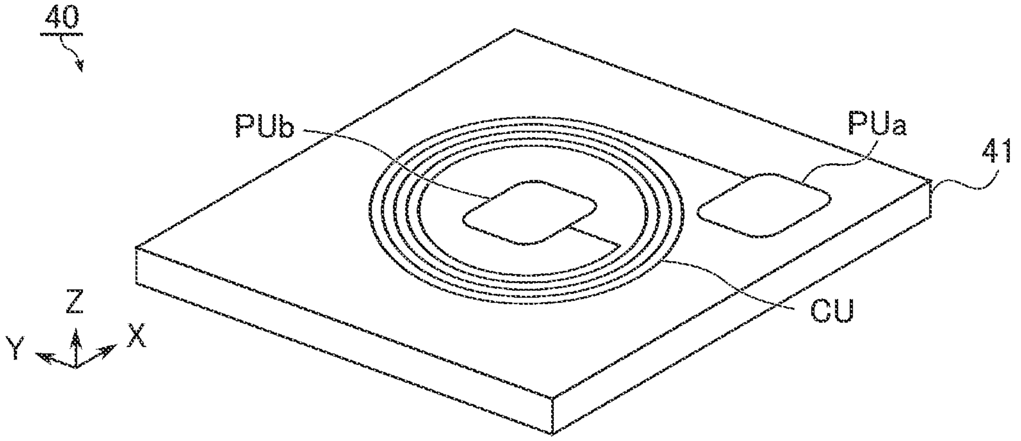
FIG. 5 is a perspective view showing an exemplary structure of a secondary circuit in the isolator module according to the present embodiment.
Figure 6:
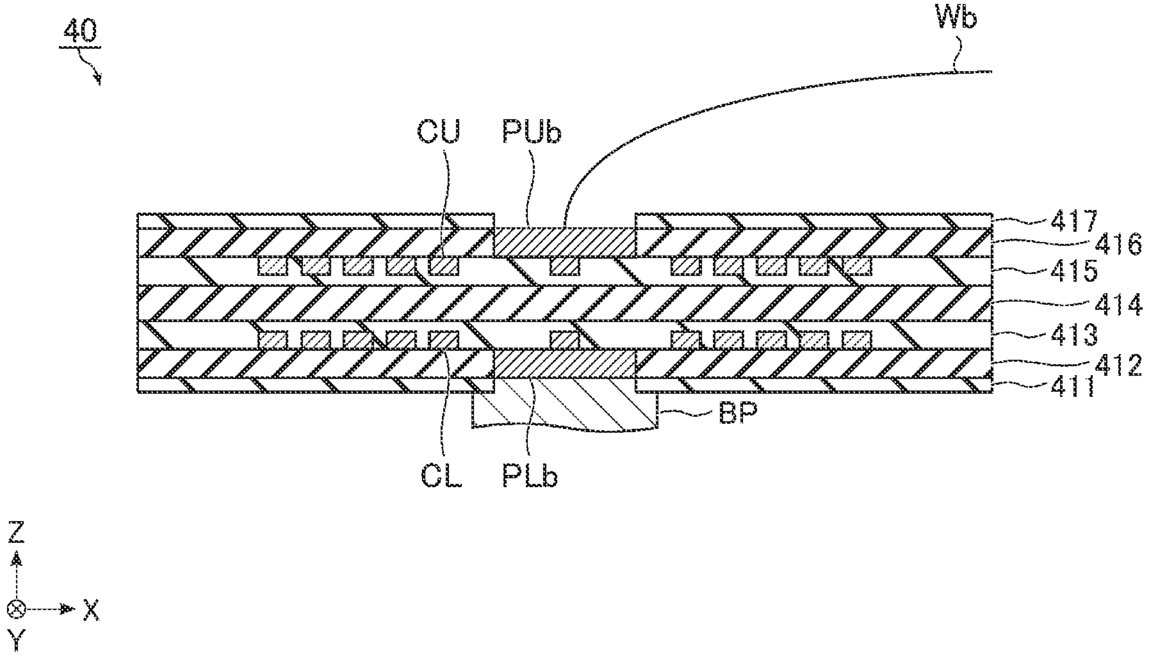
FIG. 6 is a cross-sectional view showing an exemplary cross-sectional structure of the isolator module according to the present embodiment, taken along line VI-VI in FIG. 3.

FIG. 3 is a perspective view showing an exemplary structure of the isolator module according to the present embodiment. FIG. 4 is a perspective view showing an exemplary structure of a primary circuit in the isolator module according to the present embodiment, while FIG. 5 is a perspective view showing an exemplary structure of a secondary circuit in the isolator module according to the present embodiment. FIG. 6 is a cross-sectional view showing an exemplary cross-sectional structure of the isolator module according to the present embodiment, taken along line VI-VI in FIG. 3. As illustrated in FIGS. 3 to 6, the isolator module 40 may include a wiring board 41. In FIGS. 3 to 5, conductive members inside the wiring board 41 are shown through the insulating member that covers these conductive members. In FIG. 6, the adhesive member 13 is not shown.

The wiring board 41 is a printed wiring board, which includes a primary circuit and a secondary circuit. As a printed wiring board, a flexible printed circuit (FPC) that exhibits flexibility may be adopted. The wiring board 41 may be rectangularly shaped, which is not a limitation. The wiring board 41 may be formed into any shape.

In the wiring board 41, conductive pads PUa, PUb, PLa, and PLb, a dummy pad Pdm, and coils CU and CL are arranged. The outer dimensions of the wiring board 41 are formed by stacking insulating layers 411, 412, 413, 414, 415, 416, and 417 in this order.

The pads PLa and PLb are provided in the insulating layer 412. Below this insulating layer 412 is the insulating layer 411, and a portion of the insulating layer 411 that overlaps the pads PLa and PLb when viewed in the Z direction is removed. The bottom surface of each of the pads PLa and PLb is electrically coupled to the circuit 21 of the semiconductor chip 20 with a corresponding conductor BP interposed. Each of the pads PLa and PLb is circularly shaped, which is not a limitation. The pads PLa and PLb may be each shaped into a rectangle.

As with the pads PLa and PLb, the dummy pad Pdm is provided in the insulating layer 412. The dummy pad Pdm may be arranged such that the dummy pad Pdm and pad PLa become symmetrical when viewed in the Z direction, with respect to a point of the pad PLb. The dummy pad Pdm, and pads PLa and PLb may have approximately the same size. The position and size of the dummy pad Pdm, however, are not limited to the ones illustrated in FIG. 4. The position and size of the dummy pad Pdm may be determined by referring to the barycenter of the isolator module 40 in such a manner that the isolator module 40 can be held horizontally with respect to the X-Y plane at the time of assembling the isolator module 40. The wiring board 41 including one dummy pad Pdm has been discussed, which is not a limitation. A dummy pad Pdm may not be incorporated, or two or more dummy pads Pdm may be incorporated in the insulating layer 412.

A coil CL is arranged in the insulating layer 413. The coil CL may contain copper, and its top surface may be below the top surface of the insulating layer 413, while its bottom surface may be flush with the bottom surface of the insulating layer 413. The coil CL is spirally shaped when viewed in the Z direction, and demonstrates a certain inductance. The coil CL has a central end and peripheral end. The peripheral end of the coil CL is electrically connected to the pad PLa, and the central end of the coil CL is electrically connected to the pad PLb. With the above arrangement, a current path is formed between the conductor BP coupled to the pad PLa and the conductor BP coupled to the pad PLb. The coil CL may also be referred to as a primary coil.

The coil CL may be prepared by coating its lower portion with plating. The coil CL may be formed of two or more layers of copper foil.

The pads PUa and PUb are provided in the insulating layer 416. Above the insulating layer 416 is the insulating layer 417, and the portion of this insulating layer 417 that overlaps the the pads PUa and PUb when viewed in the Z direction is removed. The bonding wires Wa and Wb are electrically connected to the pads PUa and PUb, respectively. The pads PUa and PUb may have shapes and sizes that differ from those of the pads PLa and PLb. For instance, if the pads PLa and PLb are circularly shaped, the pads PUa and PUb may be rectangularly shaped, or may be larger than the pads PLa and PLb.

The pad PUa may be arranged at a position overlapping the pad PLa, and the pad PUb may be arranged at a position overlapping the pad PLb when viewed in the Z direction.

A coil CU is arranged in the insulating layer 415. The coil CU may contain copper, and its top surface may be flush with the top surface of the insulating layer 415, while the bottom surface of the coil CU may be above the bottom surface of the insulating layer 415. The coil CU is spirally shaped when viewed in the Z direction, and demonstrates a certain inductance. The coil CU has a central end and peripheral end. The peripheral end of the coil CU is electrically connected to the pad PUa, and the central end of the coil CU is electrically connected to the pad PUb. With the above arrangement, a current path is formed between the bonding wire Wa and bonding wire Wb. The coil CU may also be referred to as a secondary coil.

The coil CU may be prepared by plating its upper portion. Alternatively, the coil CU may be formed of two or more layers of copper foil.

In the resultant structure, the pads PLa and PLb, the coil CL, the coil CU, and the pads PUa and PUb are deposited in this order from bottom to top above the conductors BP. The primary coil and secondary coil are aligned with and distanced from each other in the Z direction. The primary coil and secondary coil thereby function as a transformer.

According to the present embodiment, the coils CL and CU are arranged in the same wiring board 41 of the isolator module 40. With such an arrangement, the production process becomes less complicated in comparison with an isolator module prepared by adhering a wiring board including the primary coil to a wiring board including the secondary coil. If an isolator module is prepared by adhering a wiring board including the primary coil to a wiring board including the secondary coil, the primary coil and secondary coil may be displaced at the adhesion step, which may cause a deterioration of the characteristics of the isolator module. Suppression of such a displacement of the primary coil and secondary coil may make the producing process complicated. According to the present embodiment, since the primary coil and secondary coil are arranged in the same wiring board 41, the displacement can be readily reduced, in comparison with an isolator module prepared by adhering a wiring board including the primary coil to a wiring board including the secondary coil. Thus, complication of the producing process can be suppressed, while the characteristics of the isolator module can be maintained at sufficient levels.

According to the present embodiment, the pads PLa and PLb are arranged below the coil CL. In this arrangement, the top surfaces of the pads PLa and PLb are both directly coupled to the coil CL. Furthermore, the pads PUa and PUb are arranged above the coil CU. In this arrangement, the bottom surfaces of the pads PUa and PUb are both directly coupled to the coil CU. Thus, according to the present embodiment, the pads coupled to the primary coil do not need to be arranged outside with respect to the secondary coil and pads coupled to the secondary coil when viewed in the Z direction. This can reduce the sizes of the isolator module 40 and isolator package 1.

In a structure in which the pads coupled to the primary coil and the pads coupled to the secondary coil, which faces the primary coil, are both arranged in the upper portion of the isolator module, the pads coupled to the peripheral end and central end of the primary coil both need to be placed outside a region that includes the secondary coil and the pads coupled to the secondary coil when viewed in the Z direction. This tends to increase the sizes of the isolator module 40 and isolator package 1 in accordance with the areas of the pads coupled to the primary coil. Similarly, if the structure is such that the pads coupled to the primary coil and the pads coupled to the secondary coil are both arranged in the lower portion of the isolator module, the sizes of the isolator module 40 and isolator package 1 will be increased. According to the present embodiment, in which the pads PLa and PLb are arranged in the lower portion of the primary coil, while the pads PUa and PUb are arranged in the upper portion of the secondary coil, the sizes of the isolator module 40 and isolator package 1 can be reduced.

Furthermore, according to the present embodiment, the pads PUa and PUb may have shapes that differ from those of the pads PLa and PLb. Thus, in the producing process of the isolator package 1, the pads PUa and PUb can be formed into a shape similar to an alignment pattern generally used for assembly of the isolator module 40. The position of the isolator module 40 therefore can be adjusted at the time of assembling, without specially forming an alignment pattern on the upper portion of the isolator module 40, separately from the pads. In other words, the pads PUa and PUb can be used as an alignment pattern. From this respect also, the sizes of the isolator module 40 and isolator package 1 can be reduced.

According to the present embodiment, the isolator module 40 is electrically connected to the semiconductor chip 20 through flip-chip bonding. The isolator module 40 is therefore deposited at a position that overlaps the semiconductor chip 20 in the Z direction. From this respect also, the size of the isolator package 1 can be reduced.

Moreover, according to the present embodiment, the number of turns in each of the coils CL and CU can be reduced, and this can reduce the sizes of the isolator module 40 and isolator package 1. In particular, if an isolator module is prepared by adhering a wiring board including the primary coil to a wiring board including the secondary coil, an adhesive material is required to adhere the two wiring boards. The coil on one wiring board will then be distanced by the thickness of the adhesive material from the coil on the other wiring board. According to the present embodiment, the coils CL and CU are respectively arranged below and above a single wiring board 41, which means that an adhesive material for adhering the two wiring boards is not required. Thus, the distance between the coils CL and CU will not be increased. This means that a decrease in the coupling coefficient of the transformer, which tends to be caused by an increase in the distance between the primary coil and secondary coil, can be suppressed. Thus, suppression of the increase in the distance will keep the coupling coefficient from decreasing, as a result of which the number of turns of each of the coils CL and CU can be reduced.

According to the present embodiment, the position of the pad PLa can be determined to overlap the position of the pad PUa, and the position of the pad PLb can be determined to overlap the position of the pad PUb when viewed in the Z direction. In this manner, the rigidity of the portion where the bonding wires Wa and Wb are formed can be maintained at a sufficient level, and the bonding wires Wa and Wb can be formed with high accuracy, which can enhance the reliability of the isolator package 1.

According to the present embodiment, the isolator module 40 includes a dummy pad Pdm at the same height as the pads PLa and PLb. With this arrangement, the barycenter of the isolator module can be suitably adjusted. The isolator module 40 can thereby be easily held horizontally with respect to the X-Y plane in the producing process isolator package 1. This also contributes to the accurate formation of the bonding wires Wa and Wb, as a result of which the reliability of the isolator package 1 can be improved.

With the isolator module 40 being electrically connected to the semiconductor chip 20 through flip-chip bonding as in the present embodiment, the producing process of the isolator package 1 becomes less complicated in comparison with a structure, for example, in which the pads on the top surface and bottom surface of the isolator module are coupled to the semiconductor chips by bonding wires provided above and below the isolator module. As a result, the reliability of the isolator package 1 can be further improved.

If the pads on the top surface and bottom surface of the isolator module need to be coupled to the semiconductor chips by bonding wires above and below the isolator module, the wires are bonded to the top and bottom surfaces of the isolator module, which tends to make the producing process complicated. Furthermore, due to such complication, the fixation of the isolator module tends to become unstable and may lower the reliability of the product.

According to the present embodiment, the isolator module 40 is electrically connected to the semiconductor chip 20 through flip-chip bonding, which makes the production simpler, and enhances the reliability.

According to the present embodiment, the pads PLa and PLb are each directly coupled to the coil CL, and the pads PUa and PUb are each directly coupled to the coil CU, as described earlier. With such connections, the dielectric strength, which tends to be lowered by vias and wiring, can be suitably maintained.

As mentioned earlier, in the structure in which the pads coupled to the primary coil and the pads coupled to the secondary coil are both arranged in the upper portion of the isolator module, the pads coupled to the primary coil need to be placed outside a region including the secondary coil and the pads coupled to this secondary coil. In addition, the wires are formed to extend from the central end and peripheral end of the primary coil to the positions of the pads at a height lower than that of the primary coil. Vias also need to be formed to electrically connect these wires to the pads in the upper portion of the isolator module. Because of the vias and wires provided close to the coils, the dielectric strength of the device tends to be lowered. Similarly, if the structure is such that the pads coupled to the primary coil and the pads coupled to the secondary coil are both arranged in the lower portion of the isolator module, the dielectric strength of the device may also be lowered. According to the present embodiment, no vias or extending wires are required, and therefore the dielectric strength will not be adversely affected.

2. Modification Examples

Next, isolators according to modification examples will be described. In the modification examples described below, parts of the configuration that differ from the embodiment will be mainly focused on, while the descriptions of parts of the configuration identical to those of the embodiment will be omitted.

2.1. First Modification Example

An isolator according to the first modification example will be described. The first modification example differs from the embodiment in that the isolator module 40 is arranged at a position different from the positions of the semiconductor chips 20 and 30 when viewed in the Z direction. Parts of the configuration that differ from the embodiment will be mainly discussed, and the descriptions of the configurations identical to those of the embodiment will be omitted.

Figure 7:
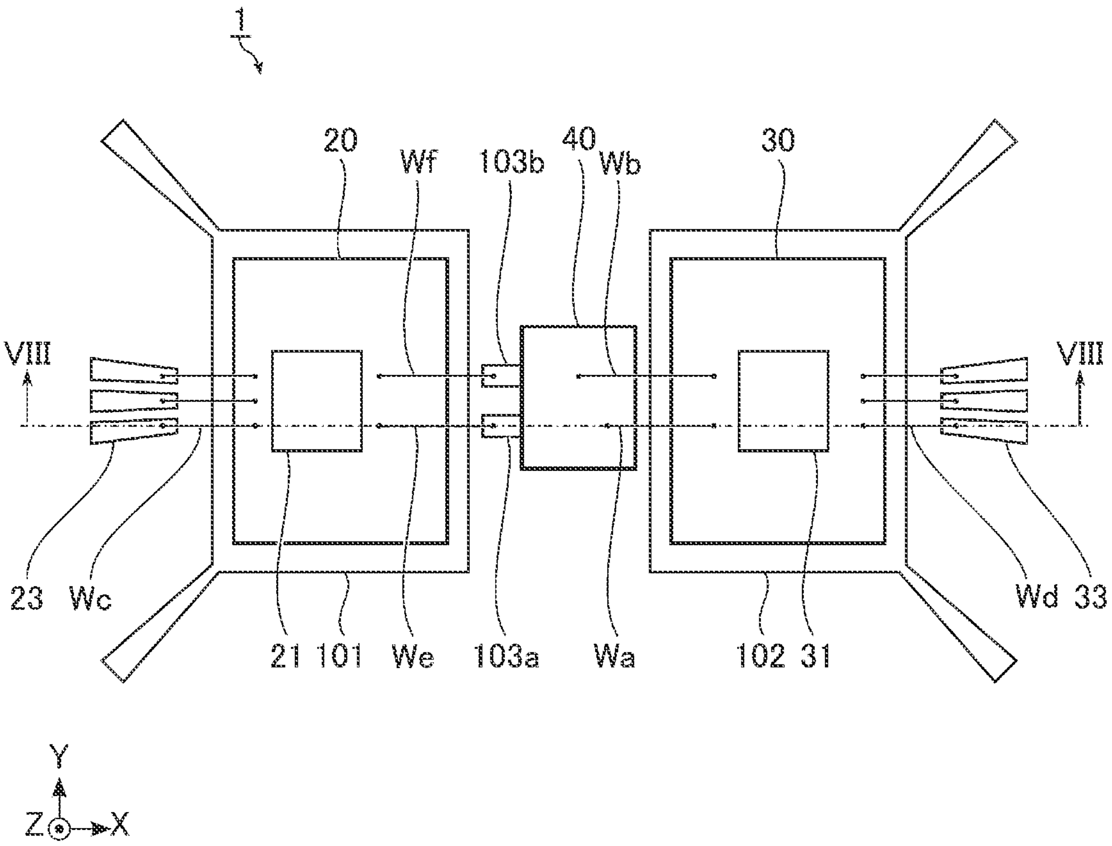
FIG. 7 is a plan view showing an exemplary planar layout of an isolator according to the first modification example.
Figure 8:
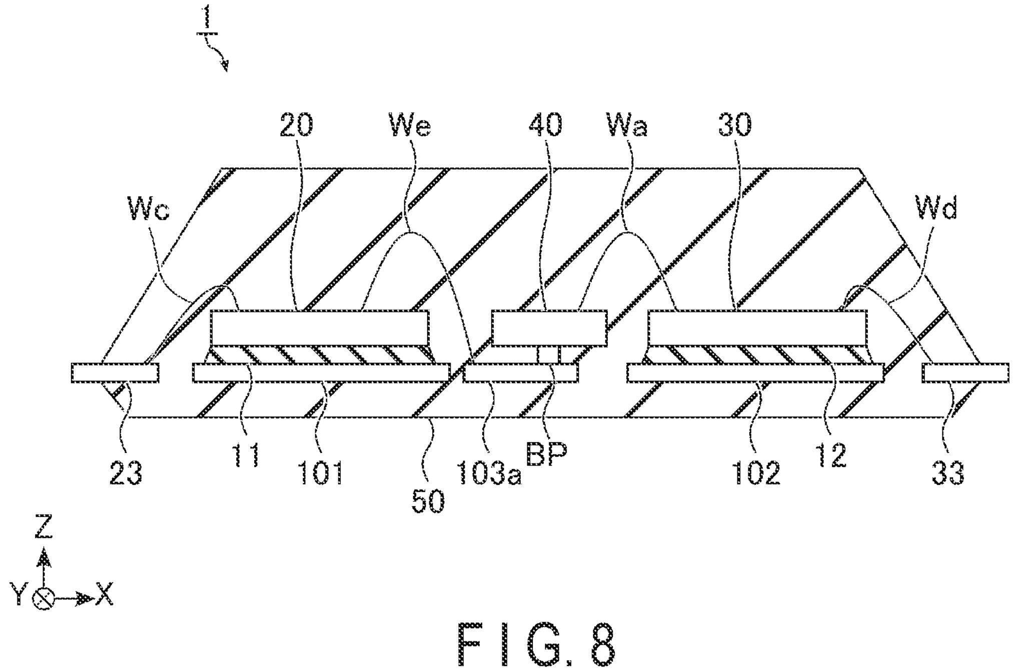
FIG. 8 is a cross-sectional view showing an exemplary cross-sectional structure of the isolator according to the first modification example, taken along line VIII-VIII in FIG. 7.

FIG. 7 is a plan view showing an exemplary planar layout of the isolator according to the first modification example, and FIG. 8 is a cross-sectional view showing a cross-sectional structure of the isolator, taken along line VIII-VIII of FIG. 7. FIGS. 7 and 8 correspond to FIGS. 1 and 2, respectively, of the embodiment.

The isolator package 1 includes frames 101, 102, 103*a*, and 103*b*, semiconductor chips 20 and 30, an isolator module 40, and an insulating member 50. The frames 101, 102, 103*a*, and 103*b* may be integrally formed, while mutually insulating these frames, although such a structure is not illustrated. The insulating member 50 is not shown in FIG. 7.

The frames 101, 102, 103*a*, and 103*b* may be metal plate members. The semiconductor chip 20 is arranged on the top surface of the frame 101 with an insulative adhesive member 11 interposed. The semiconductor chip 30 is arranged on the top surface of the frame 102 with an insulative adhesive member 12 interposed. The isolator module 40 is arranged on part of the top surface of the frame 103*a* and part of the top surface of the frame 103*b* with conductors BP interposed. The frames 101 and 102 serve as substrates that support the semiconductor chips 20 and 30, respectively. The frames 103*a* and 103*b* serve as wiring that electrically connects the semiconductor chip 20 to the isolator module 40.

The circuit 21 of the semiconductor chip 20 is electrically connected to the frames 103*a* and 103*b* by bonding wires We and Wf, respectively. With such connections, the semiconductor chip 20 and isolator module 40 are electrically connected to each other by the bonding wires We and Wf and the frames 103*a* and 103*b*.

As in the embodiment, the first modification example can also avoid the complication of the producing process. Furthermore, as in the embodiment, an increase in the size of the isolator package 1 can be suppressed due to the arrangement of the pads PLa and PLb in the lower portion of the coil CL and the pads PUa and PUb in the upper portion of the coil CU; the pads PUa and PUb configured to be usable as an alignment pattern; and the suppressed number of turns of the coils CL and CU. In addition, the reliability can be improved, and the dielectric strength can be protected from becoming deteriorated, as in the embodiment.

According to the first modification example, the isolator module 40 is arranged on the frames 103*a* and 103*b* at a position different from the positions of the semiconductor chips 20 and 30 when viewed in the Z direction. The semiconductor chips 20 and 30 and the isolator module 40 therefore can be distanced from each other, which can facilitate the assembling of the devices in the producing process. The reliability of the isolator package 1 can also be improved.

2.2. Second Modification Example

Next, the isolator according to the second modification example will be described. The second modification example differs from the first modification example in that the semiconductor chips 20 and 30 and the isolator module 40 are arranged above a semiconductor substrate. Parts of the configuration that differ from the first modification example will be mainly discussed, and the descriptions of parts of the configuration identical to those of the embodiment will be omitted.

Figure 9:
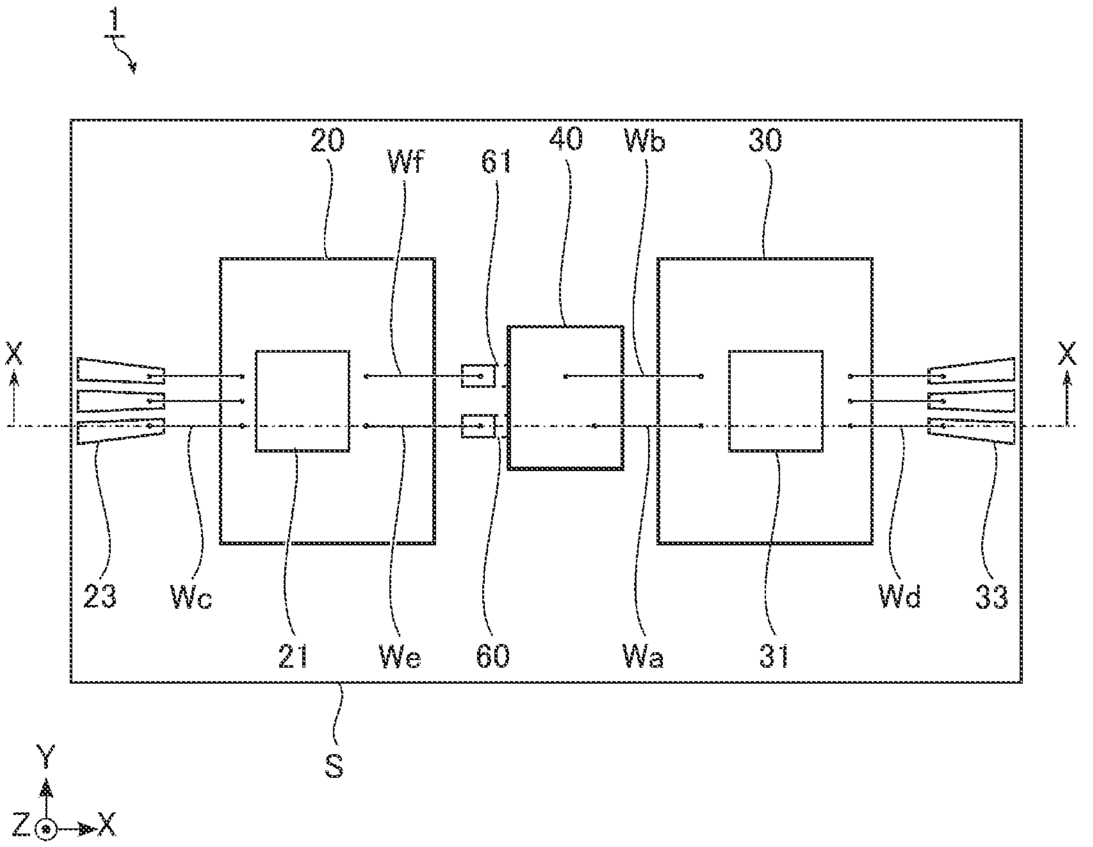
FIG. 9 is a plan view showing an exemplary planar layout of an isolator according to the second modification example.
Figure 10:
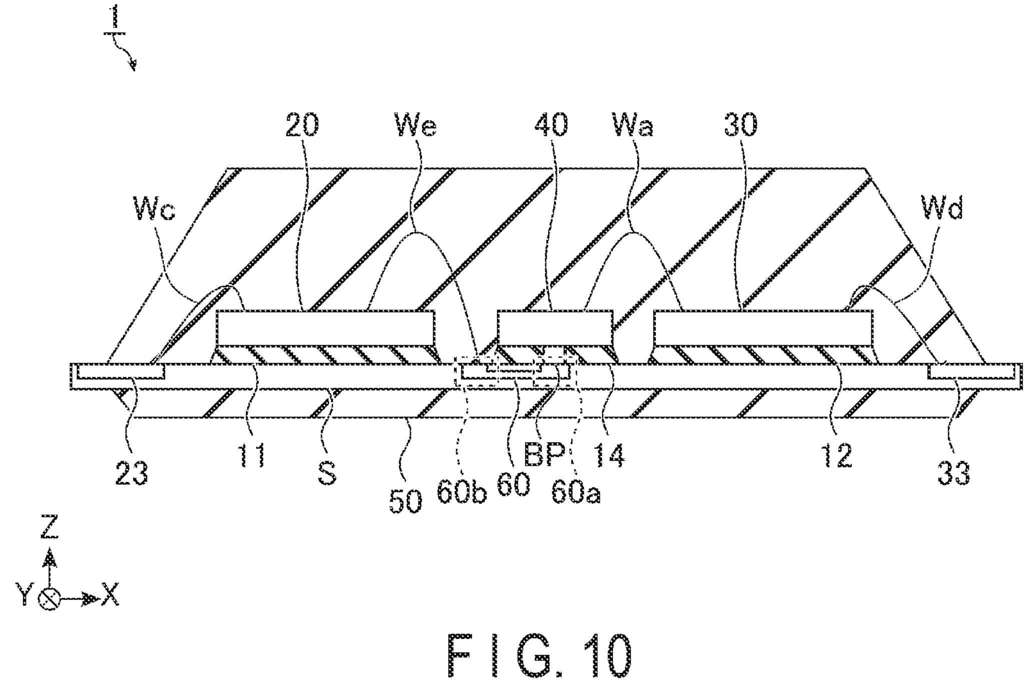
FIG. 10 is a cross-sectional view showing an exemplary cross-sectional structure of the isolator according to the second modification example, taken along line X-X in FIG. 9.

FIG. 9 is a plan view showing an exemplary planar layout of the isolator according to the second modification example, and FIG. 10 is a cross-sectional view showing an exemplary cross-sectional structure of the isolator according to the second modification example, taken along line X-X in FIG. 9. FIGS. 9 and 10 correspond to FIGS. 1 and 2, respectively, of the embodiment.

The isolator package 1 includes a semiconductor substrate S. Pins 23 and 33 and wires 60 and 61 are provided in the semiconductor substrate S. In this semiconductor substrate S, each of the pins 23 and 33 and each of the wires 60 and 61 are exposed at least partially on the top surface of the semiconductor substrate S. The wires 60 and 61 electrically connect the semiconductor chip 20 to the isolator module 40. The wires 60 and 61 each include a first portion that is exposed on the top surface of the semiconductor substrate S and electrically connected to the isolator module 40, and a second portion that is exposed on the top surface of the semiconductor substrate S and electrically connected to the semiconductor chip 20. FIG. 10 shows the first portion 60*a* and second portion 60*b* of the wire 60.

The semiconductor chips 20 and 30 and isolator module 40 are arranged on the top surface of the semiconductor substrate S with the insulative adhesive members 11, 12, and 14 respectively interposed. The isolator module 40 is electrically connected to the wires 60 and 61 by way of bumps BP arranged between the semiconductor substrate S and isolator module 40. The bumps BP may be provided on the top surface of the first portion 60*a* of the wire 60 and the top surface of the first portion of the wire 61. The semiconductor substrate S serves as a substrate that supports the semiconductor chips 20 and 30, and the isolator module 40.

The circuit 21 of the semiconductor chip 20 is electrically connected to the wires 60 and 61 by way of the bonding wires We and Wf, respectively. The bonding wires We and Wf are electrically connected to the second portion 60*b* of the wire 60 and the second portion of the wire 61, respectively. With such an arrangement, the semiconductor chip 20 and isolator module 40 are electrically connected to each other by the bonding wires We and Wf and the wires 60 and 61.

This arrangement can suppress the complication of the producing process, as in the embodiment and the first modification example. Furthermore, an increase in the sizes of the isolator module and isolator package can be suppressed, as in the first modification example. The reliability can be improved, while the deterioration of the dielectric strength can be suppressed, as in the embodiment and the first modification example.

According to the second modification example, the assembling of each device becomes simpler, and the reliability can be improved, as in the first modification example.

2.3. Third Modification Example

The isolator according to the third modification example will be described next. The third modification example differs from the embodiment in that the isolator package includes two signal transmission paths. Parts of the configuration that differ from the embodiment will be mainly discussed, and the descriptions of parts of the configuration identical to those of the embodiment will be omitted.

Figure 11:
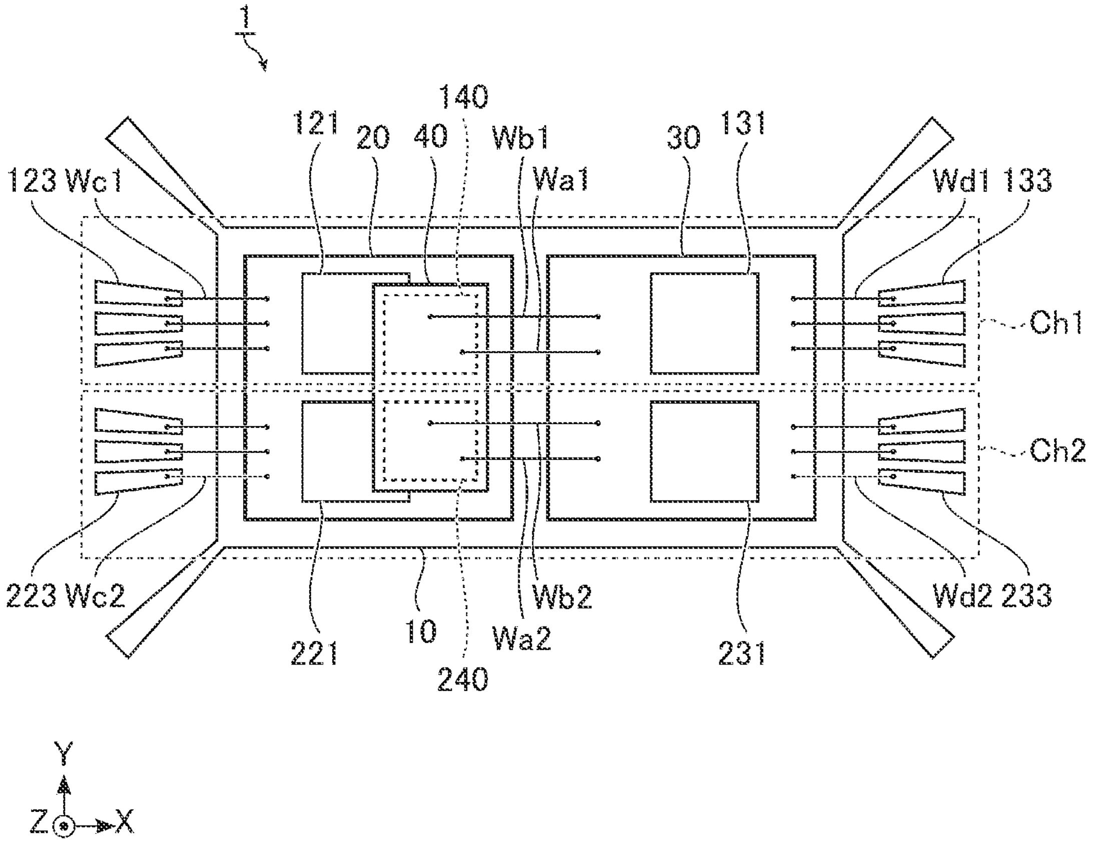
FIG. 11 is a plan view showing an exemplary planar layout of an isolator according to the third modification example.

FIG. 11 is a cross-sectional view showing an exemplary cross-sectional structure of the isolator according to the third modification example. FIG. 11 corresponds to FIG. 1 of the embodiment. In the third modification example, a cross-sectional structure along the X-Z plane will be the same as that of the embodiment as illustrated in FIG. 2, and therefore the descriptions of this cross-sectional structure will be omitted.

As shown in FIG. 11, the isolator package 1 includes a frame 10, semiconductor chips 20 and 30, an isolator module 40, and an insulating member 50.

Circuits 121 and 221 are formed on the semiconductor chip 20, and aligned with each other in the Y direction. Each of the circuits 121 and 221 includes a signal transmission/reception circuit and a signal modulation/demodulation circuit. The circuits 121 and 221 are each electrically connected to the isolator module 40 by way of a conductor BP coupled to the top surface of the semiconductor chip 20. The semiconductor chip 20 is electrically connected to the pin 123 by a bonding wire Wc1. The circuit 121 is thereby electrically connected to the pin 123 by the bonding wire Wc1. The semiconductor chip 20 is electrically connected to the pin 223 by a bonding wire Wc2. The circuit 221 is thereby electrically connected to the pin 223 by the bonding wire Wc2.

Circuits 131 and 231 are formed on the semiconductor chip 30, and are aligned with each other in the Y direction. The circuits 131 and 231 each include a signal transmission/reception circuit and a signal modulation/demodulation circuit. The circuit 131 is electrically connected to the isolator module 40 by bonding wires Wa1 and Wb1. The circuit 231 is electrically connected to the isolator module 40 by bonding wires Wa2 and Wb2. The semiconductor chip 30 is electrically connected to the pin 133 by a bonding wire Wd1. The circuit 131 is thereby electrically connected to the pin 133 by the bonding wire Wd1. The semiconductor chip 30 is electrically connected to the pin 233 by a bonding wire Wd2. The circuit 231 is thereby electrically connected to the pin 233 by the bonding wire Wd2.

The isolator module 40 includes isolator portions 140 and 240. The isolator portions 140 and 240 may be aligned with each other in the Y direction. The isolator module 40 is configured to transmit signals while insulating the circuits 121 and 131 from each other using the isolator portion 140, where one of the circuits 121 and 131 serves as a transmission circuit, and the other serves as a reception circuit. The isolator module 40 is further configured to transmit signals while insulating the circuits 221 and 231 from each other using the isolator portion 240, where one of the circuits 221 and 231 serves as a transmission circuit, and the other serves as a reception circuit. The structure of the isolator module 40 will be describe later.

In the above configuration, the circuit 121 of the semiconductor chip 20, the circuit 131 of the semiconductor chip 30, and the isolator portion 140 of the isolator module 40 constitute a channel Ch1 in the isolator package 1. The circuit 221 of the semiconductor chip 20, the circuit 231 of the semiconductor chip 30, and the isolator portion 240 of the isolator module 40 constitute a channel Ch2 in the isolator package 1.

In the above description, each of the circuits 121, 131, 221, and 231 includes a transmission/reception circuit, which is not a limitation. For instance, one of the circuits 121 and 131 may include a transmission circuit, and the other one may include a reception circuit. Similarly, one of the circuits 221 and 231 may include a transmission circuit, and the other one may include a reception circuit. That is, the channels Ch1 and Ch2 may be each configured as a unidirectional signal transmission channel.

Figure 12:
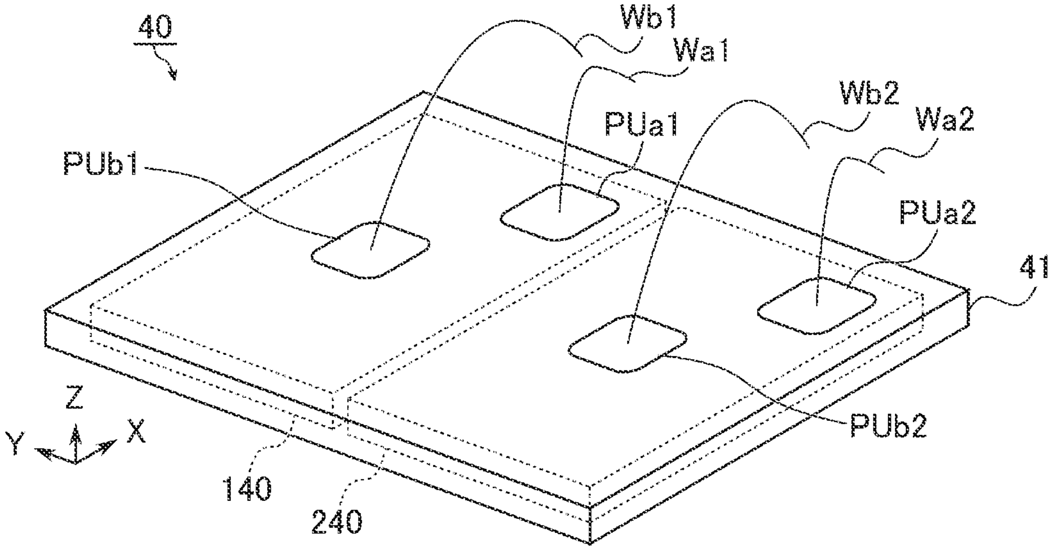
FIG. 12 is a perspective view showing an exemplary structure of an isolator module according to the third modification example.
Figure 13:
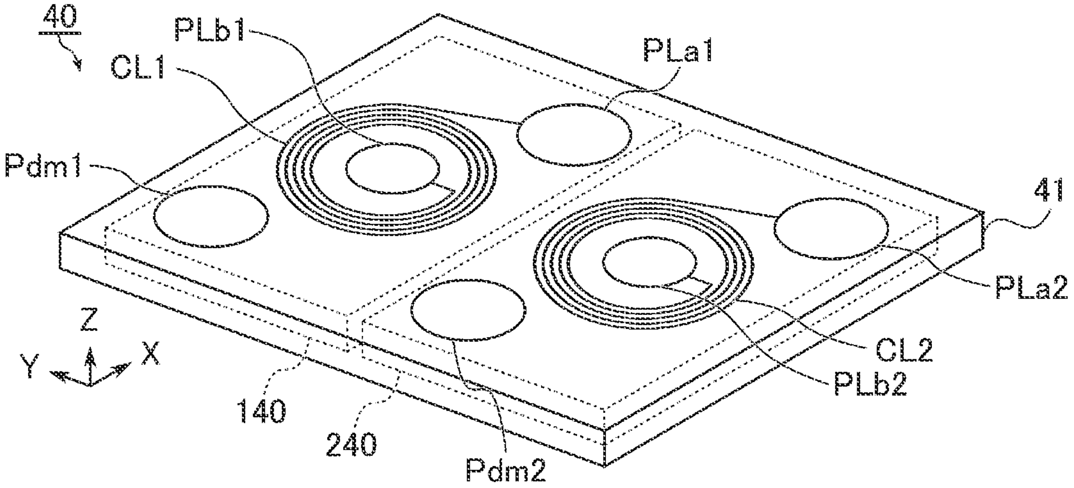
FIG. 13 is a perspective view showing an exemplary structure of a primary circuit of the isolator module according to the third modification example.
Figure 14:
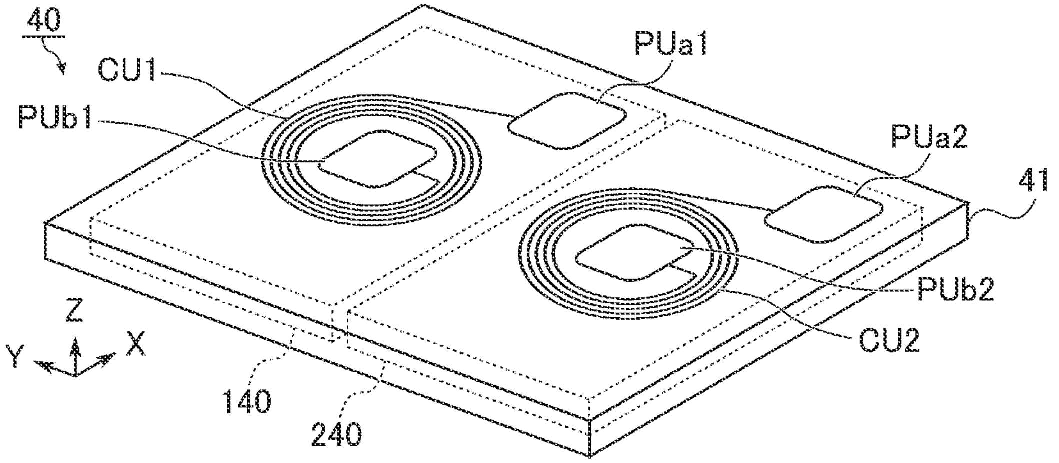
FIG. 14 is a perspective view showing an exemplary structure of a secondary circuit of the isolator module according to the third modification example.

Next, the configuration of the isolator module 40 will be described. FIG. 12 is a perspective view showing an exemplary structure of the isolator module according to the third modification example. FIG. 13 is a perspective view showing an exemplary structure of the primary circuit of the isolator module according to the third modification example, and FIG. 14 is a perspective view showing an exemplary structure of the secondary circuit of the isolator module. In FIGS. 12, 13, and 14, conductive members inside the wiring board 41 are shown through the insulating member that covers these conductive members.

Conductive pads PLa1, PLb1, PUa1, PUb1, PLa2, PLb2, PUa2, and PUb2, dummy pads Pdm1 and Pdm2, and coils CL1, CU1, CL2, and CU2 are arranged in the wiring board 41. The pads PLa1, PLb1, PUa1, and PUb1, and dummy pad Pdm1 are included in the isolator portion 140, while the pads PLa2, PLb2, PUa2, and PUb2, and dummy pad Pdm2 are included in the isolator portion 240.

The cross-sectional structure of the X-Z cross section including the pad PUb1 and the cross-sectional structure of the X-Z cross section including the pad PUb2 will be the same as the cross-sectional structure of the wiring board 41 of the embodiment as illustrated in FIG. 6.

In the isolator portion 140, the pads PLa1 and PLb1 are arranged in the insulating layer 412, as are the pads PLa and PLb according to the present embodiment. Below the insulating layer 412 is the insulating layer 411, and a portion of this insulating layer 411 that overlaps the pads PLa1 and PLb1 when viewed in the Z direction is removed. The bottom surface of each of the pads PLa1 and PLb1 is electrically connected to the circuit 121 of the semiconductor chip 20 with a corresponding conductor BP interposed. The shapes of the pads PLa1 and PLb1 may be similar to those of the pads PLa and PLb according to the embodiment.

The dummy pad Pdm1 is provided in the insulating layer 412, as is the dummy pad Pdm according to the embodiment. The dummy pad Pdm1 and pad PLa1 may be arranged such that their positions are symmetrical when viewed in the Z direction, with respect to a point of the pad PLb1. The dummy pad Pdm1 and the pads PLa1 and PLb1 may have approximately the same size. In the example of FIG. 12, the isolator portion 140 includes one dummy pad Pdm1, which is not a limitation. No dummy pad Pdm1 may be incorporated, or two or more dummy pad Pdm1 may be incorporated in the insulating layer 412.

The coil CL1 is arranged such that its top surface and bottom surface match the heights of the top surface and bottom surface of the coil CL according to the embodiment. The coil CL1 may contain copper. The peripheral end of the coil CL1 is electrically connected to the pad PLa1, while the central end of the coil CL1 is electrically connected to the pad PLb1. With such an arrangement, a current path is formed between the conductor BP coupled to the pad PLa1 and the conductor BP coupled to the pad PLb1. In the isolator portion 140, the coil CL1 may also be referred to as the primary coil.

The pads PUa1 and PUb1 are provided in the insulating layer 416, as are the pads PUa and PUb according to the embodiment. Above the insulating layer 416 is the insulating layer 417, and a portion of this insulating layer 417 that overlaps the pads PUa1 and PUb1 when viewed in the Z direction is removed. The pads PUa1 and PUb1 are electrically connected to the bonding wires Wa1 and Wb1, respectively. The shapes of the pads PUa1 and PUb1 may be similar to those of the pads PUa and PUb according to the embodiment.

The pad PUa1 may be arranged at a position overlapping the pad PLa1, and the pad PUb1 may be arranged at a position overlapping the pad PLb1 when viewed in the Z direction.

The coil CU1 is arranged such that its top surface and bottom surface match the heights of the top surface and bottom surface of the coil CU according to the embodiment. The coil CU1 may contain copper. The peripheral end of the coil CU1 is electrically connected to the pad PUa1, while the central end of the coil CU1 is electrically connected to the pad PUb1. With such an arrangement, a current path is formed between the bonding wire Wa1 and bonding wire Wb1. In the isolator portion 140, the coil CU1 may also be referred to as the secondary coil.

The coils CL1 and CU1 are aligned with and distanced from each other in the Z direction. In this manner, the coils CL1 and CU1 function as a transformer.

The isolator portion 240 may have a structure substantially the same as that of the isolator portion 140. That is, the pads PUa2, PUb2, PLa2, and PLb2, the dummy pad Pdm2, and the coils CU2 and CL2 are arranged in the isolator portion 240 in the same manner as the pads PUa1, PUb1, PLa1, and PLb1, the dummy pad Pdm1, and the coils CU1 and CL1 in the isolator portion 140, except that their positions on the X-Y plane differ from their counterparts. The pads PUa2 and PUb2 are electrically connected to the bonding wires Wa2 and Wb2, respectively.

In the example illustrated in FIGS. 12, 13, and 14, the structures of the isolator portion 140 and the isolator portion 240 are similar to each other, which is not a limitation. The isolator portion 140 and isolator portion 240 may be arranged symmetrically with respect to the X-Z plane.

In the third modification example, the isolator package 1 includes two channels Ch1 and Ch2, which is not a limitation. The number of channels included in the isolator package 1 may be larger than two.

With the above structure, the complication of the producing process can be suppressed, as in the embodiment and the first and second modification examples.

Furthermore, according to the third modification example, an increase in the size of the isolator package can be suppressed as in the embodiment. The reliability can also be enhanced, and the deterioration of the dielectric strength can be suppressed as in the embodiment and the first and second modification examples.

According to the third modification example, the isolator package 1 includes multiple channels. In this manner, in comparison with a multi-channel structure in which multiple isolator packages each having a single channel are adopted, an increase in the overall size can be suppressed.

2.4. Fourth Modification Example

The isolator according to the fourth modification example will be described. The fourth modification example differs from the embodiment in that the pad PUa of the isolator module 40 is arranged at a position that overlaps the position of the dummy pad Pdm when viewed in the Z direction. The configurations that differ from the embodiment will be mainly discussed, and the descriptions of parts of the configuration identical to those of the embodiment will be omitted.

Figure 15:
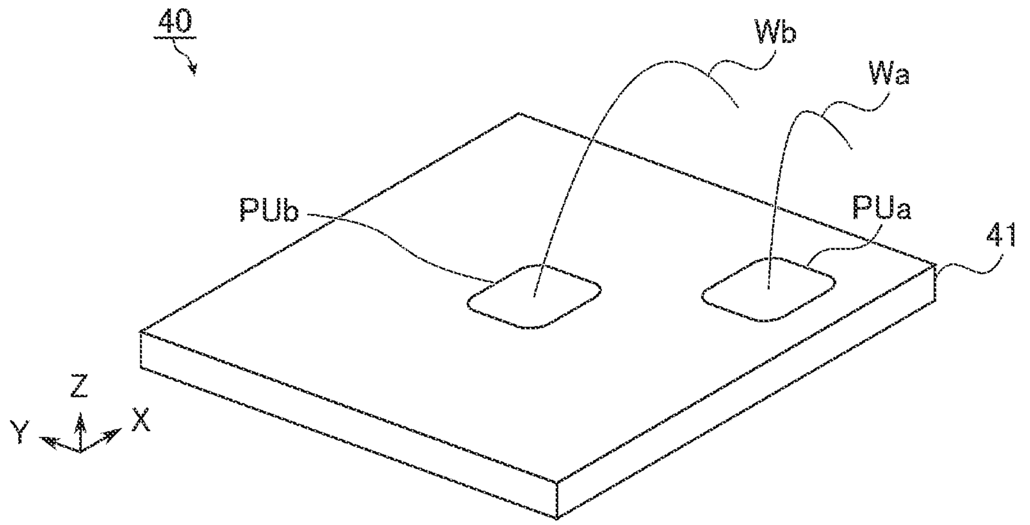
FIG. 15 is a perspective view showing an exemplary structure of an isolator module according to the fourth modification example.
Figure 16:
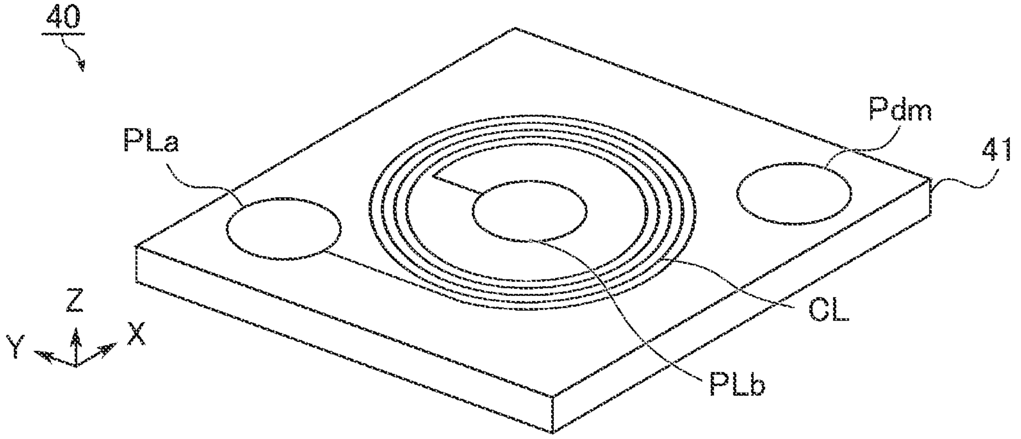
FIG. 16 is a perspective view showing an exemplary structure of a primary circuit of the isolator module according to the fourth modification example.
Figure 17:
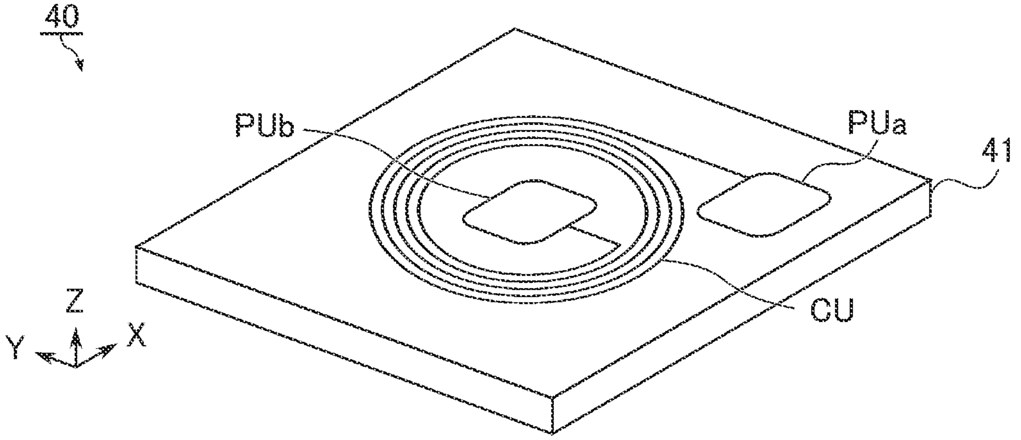
FIG. 17 is a perspective view showing an exemplary structure of a secondary circuit of the isolator module according to the fourth modification example.

FIG. 15 is a perspective view showing an exemplary structure of the isolator module according to the fourth modification example. FIG. 16 is a perspective view showing an exemplary structure of the primary circuit of the isolator module, and FIG. 17 is a perspective view showing an exemplary structure of the secondary circuit of the isolator module. In FIGS. 15, 16, and 17, conductive members inside the wiring board 41 are shown through the insulating member that covers these conductive members.

In the fourth modification example, the pads PLa and PUa are provided at different positions when viewed in the Z direction, and therefore do not overlap each other when viewed in the Z direction.

The dummy pad Pdm is arranged at a position overlapping the pad PUa when viewed in the Z direction.

With such a structure, the complication of the producing process can be suppressed, as in the embodiment and the first to third modification examples. An increase in the size of the isolator module can also be suppressed, as in the embodiment and the third modification example. The reliability can be enhanced, and the deterioration of the dielectric strength can be suppressed, as in the embodiment and the first to third modification examples.

According to the fourth modification example, even if the positions of the pads PLa and PUa differ from each other, the dummy pad Pdm is arranged at a position overlapping the pad PUa when viewed in the Z direction. Thus, the rigidity of the portion where the bonding wire Wa is formed can be maintained at a sufficient level, as a result of which the bonding wire Wa can be formed with high accuracy. The reliability of the isolator package 1 can also be improved.

3. Other Examples

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An isolator comprising:
an isolator module including a first substrate, a first insulating layer in contact with a top surface of the first substrate, a second insulating layer in contact with a bottom surface of the first substrate, a first coil embedded in the first insulating layer, and a second coil embedded in the second insulating layer and facing the first coil;
a first conductor arranged below the isolator module and electrically connected to a bottom surface of the second coil; and
a first chip,
wherein the second coil and a top surface of the first chip are electrically connected to each other via the first conductor.

2. The isolator of claim 1, wherein
the first chip is arranged below the first conductor, and
the first conductor is in contact with the top surface of the first chip.

3. The isolator of claim 1, further comprising:
a first wiring arranged below the first conductor,
wherein the first conductor is in contact with a top surface of the first wiring.

4. The isolator of claim 3, further comprising:
a frame above which the first chip is arranged,
wherein the first wiring and the frame are arranged independently from each other.

5. The isolator of claim 3, further comprising:
a second substrate above which the first chip is arranged,
wherein the first wiring is arranged on the second substrate.

6. The isolator of claim 3, wherein
the first chip and the first wiring are electrically connected to each other by a wire.

7. The isolator of claim 1, further comprising:
a first pad in contact with the bottom surface of the second coil at one end of the second coil,
wherein the first conductor is in contact with a bottom surface of the first pad.

8. The isolator of claim 7, further comprising:
a second conductor arranged below the isolator module and electrically connected to the bottom surface of the second coil; and
a second pad in contact with the bottom surface of the second coil at the other end of the second coil,
wherein the second coil and the top surface of the first chip are electrically connected to each other with the second conductor interposed, in addition to the first conductor being interposed, and
the second conductor is in contact with a bottom surface of the second pad.

9. The isolator of claim 7, further comprising:
a dummy pad arranged at a same height as the first pad and electrically insulated from the second coil.

10. The isolator of claim 9, further comprising:
a second chip,
wherein the first coil and the second chip are electrically connected to each other by a wire.

11. The isolator of claim 10, further comprising:
a third pad in contact with a top surface of the first coil at one end of the first coil,
wherein the third pad is electrically connected to the second chip.

12. The isolator of claim 11, wherein
the first pad is arranged to overlap the third pad, when viewed from above.

13. The isolator of claim 11, wherein
the third pad is arranged to overlap the dummy pad, when viewed from above.

14. The isolator of claim 1, further comprising:
a third coil arranged in the first insulating layer, apart from the first coil;
a fourth coil arranged in the second insulating layer, apart from the second coil, to face the third coil; and
a second conductor arranged below the isolator module and electrically connected to a bottom surface of the fourth coil,
wherein the fourth coil and the top surface of the first chip are electrically connected to each other with the second conductor interposed.

15. The isolator of claim 1, wherein
the first conductor is formed of a bump or by soldering.

16. The isolator of claim 1, wherein
the isolator module and the first chip are sealed in by a first insulator.

* * * * *